(12) United States Patent
Kaiser

(10) Patent No.: US 12,240,749 B2
(45) Date of Patent: Mar. 4, 2025

(54) MEMS DEVICE, ASSEMBLY COMPRISING THE MEMS DEVICE, AND METHODS FOR OPERATING THE MEMS DEVICE

(71) Applicant: Fraunhofer-Gesellschaft zur Förderung der angewandten Forschung e.V., Munich (DE)

(72) Inventor: Bert Kaiser, Dresden (DE)

(*) Notice: Subject to any disclaimer, the term of this patent is extended or adjusted under 35 U.S.C. 154(b) by 494 days.

(21) Appl. No.: 17/755,934

(22) PCT Filed: Nov. 13, 2019

(86) PCT No.: PCT/EP2019/081217
§ 371 (c)(1),
(2) Date: May 12, 2022

(87) PCT Pub. No.: WO2021/093950
PCT Pub. Date: May 20, 2021

(65) Prior Publication Data
US 2022/0380200 A1 Dec. 1, 2022

(51) Int. Cl.
*B81B 3/00* (2006.01)
*B81C 1/00* (2006.01)

(52) U.S. Cl.
CPC ........ *B81B 3/0021* (2013.01); *B81C 1/00158* (2013.01); *B81B 2201/0257* (2013.01); *B81B 2201/032* (2013.01)

(58) Field of Classification Search
CPC .......... B81B 3/0021; B81B 2201/0257; B81B 2201/032; B81B 2201/036; B81B 2203/051; B81C 1/00158
See application file for complete search history.

(56) References Cited

U.S. PATENT DOCUMENTS

| | | | | |
|---|---|---|---|---|
| 2009/0124035 A1* | 5/2009 | Rey | ..................... | B81C 1/00158 257/E21.001 |
| 2012/0137773 A1* | 6/2012 | Judy | .................. | G01C 19/5698 73/504.12 |
| 2017/0363493 A1 | 12/2017 | Fain et al. | | |

FOREIGN PATENT DOCUMENTS

| | | |
|---|---|---|
| DE | 102017203722 A1 | 9/2018 |
| DE | 102010029936 A1 | 12/2021 |

* cited by examiner

*Primary Examiner* — Herve-Louis Y Assouman
(74) *Attorney, Agent, or Firm* — 2SPL Patent Attorneys PartG mbB; Kieran O'Leary

(57) ABSTRACT

Proposed is a MEMS device comprising a layer stack having at least one second layer formed between a first layer and a third layer. At least one first cavity is formed in the second layer. The MEMS device further comprises a laterally deflectable member having an end connected to a sidewall of the first cavity and a free end. Further, the MEMS device includes a passive element rigidly tethered to the free end of the laterally deflectable element to follow movement of the laterally deflectable element. The laterally deflectable element and the passive element divide the first cavity into a first sub-cavity and a second sub-cavity. The first sub-cavity is in contact with an ambient fluid of the MEMS device via at least a first opening. Further, the second subcavity is in contact with the ambient fluid of the MEMS device via at least a second opening. The at least one first opening is formed in a different layer of the first layer and the third layer than the at least one second opening.

21 Claims, 12 Drawing Sheets

A-A

B-B

E-E

C-C

Figure 1:
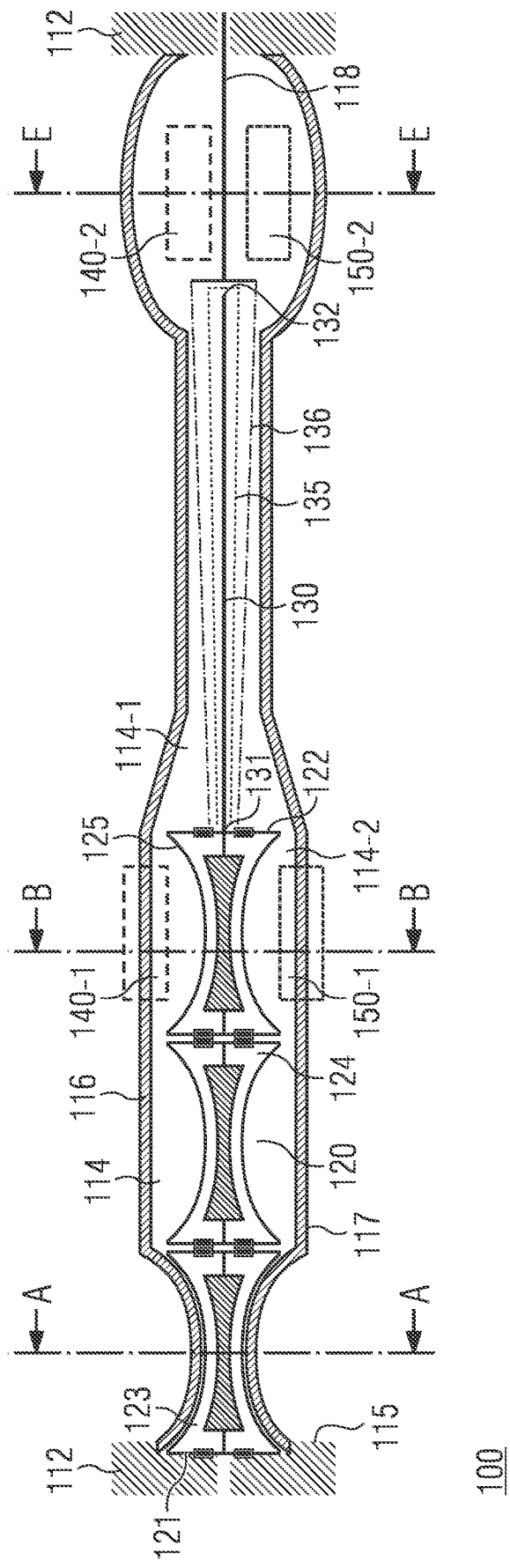

FIG. 9
 ~130
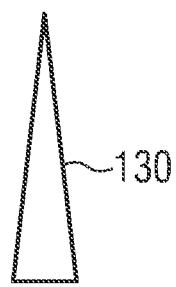 ~130
 ~130
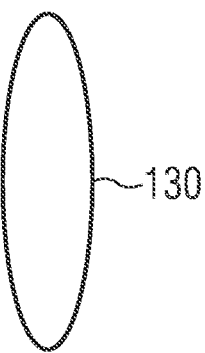 ~130

MEMS DEVICE, ASSEMBLY COMPRISING THE MEMS DEVICE, AND METHODS FOR OPERATING THE MEMS DEVICE

TECHNICAL AREA

The present disclosure deals with MicroElectroMechanical Systems (MEMS) devices. In particular, embodiments relate to a MEMS device, an assembly comprising the MEMS device, and methods for operating the MEMS device.

BACKGROUND

MEMS devices can be used in many ways to interact with a gas or liquid in the environment. For example, MEMS devices can be used to excite a gas in the environment to vibrate. Such MEMS devices can be used for loudspeakers, for example. MEMS devices can also be used to detect vibrations of a gas in the environment. Such MEMS devices can be used for microphones, for example.

Furthermore, a variety of passive elements that can be connected to deflectable actuators have been proposed in the literature. An example of this is the large number of micromirror applications. Similarly, diaphragms for loudspeakers or microphones can also be considered passive elements. However, all technologies have in common that the deflection of the passive elements takes place out of the substrate plane (out-of-plane).

An in-plane movement of a passive element driven by micromechanical actuators is proposed in document DE 10 2017 206 766 A1. In this case, deflectable elements are connected to a surrounding substrate on opposite sides. The respective freely movable ends are connected to plates via spring elements or rigid elements and can thus transmit forces to the plate. At least two such plates are arranged opposite each other and laterally close off a cavity that is connected to the surroundings through an opening in the substrate. To account for the variable geometric dimensions of the actuators during deflection, the plates must be connected to the actuators via spring elements. This has a detrimental effect on the performance of the resulting transducers, as the springs affect the vibration characteristics of the overall system.

It would be desirable to have a MEMS element that could achieve high sound pressure with minimized component surface area. With optimized space utilization, the MEMS element should provide a large fluidic effective area in the substrate plane for interaction with a surrounding fluid (ambient fluid) while minimizing capacitance loading of the device surface.

With this in mind, one task is to provide an improved MEMS structure for interaction with an ambient fluid.

SUMMARY

According to the invention, the task is solved by a MEMS device, an assembly comprising the MEMS device, and methods for operating the MEMS device according to the independent claims. Further aspects as well as further embodiments of the invention are described in the dependent claims, the following description as well as in the figures.

A first embodiment relates to a MEMS device comprising a layer stack having at least a second layer formed between a first layer and a third layer. At least one first cavity is formed in the second layer. The MEMS device further comprises a laterally deflectable member having an end connected to a sidewall of the first cavity and a free end. Further, the MEMS device includes a passive element rigidly tethered to the free end of the laterally deflectable element to follow movement of the laterally deflectable element. The laterally deflectable element and the passive element divide the first cavity into a first sub-cavity and a second sub-cavity. The first sub-cavity is in contact with an ambient fluid of the MEMS device via at least a first opening. Further, the second subcavity is in contact with the ambient fluid of the MEMS device via at least a second opening. The at least one first opening is formed in a different layer of the first layer and the third layer than the at least one second opening.

Further, a second embodiment relates to an assembly comprising at least one MEMS device described herein. In addition, the assembly comprises a control circuit configured to provide at least a first potential to the laterally deflectable element of the at least one MEMS device to operate the laterally deflectable element as an actuator to affect the ambient fluid. Alternatively or supplementally, the assembly comprises a measurement circuit configured to measure at least a second potential of the laterally deflectable element to operate the laterally deflectable element as a sensor for the ambient fluid.

A third embodiment relates to a first method for operating a MEMS device described herein. The method includes laterally deforming the laterally deflectable member in a first direction by applying a potential to increase a volume of the first subcavity and decrease a volume of the second subcavity during a first time interval to affect the ambient fluid. Further, the method comprises laterally deforming the laterally deflectable member in an opposite second direction by applying the potential to increase the volume of the second subcavity and decrease the volume of the first subcavity during a second time interval for influencing the ambient fluid.

Further, a fourth embodiment relates to a second method for operating a MEMS device described herein, wherein the laterally deflectable element and the passive element can move laterally with respect to sidewalls of the first cavity to adjust volumes of the first subcavity and the second subcavity depending on the ambient fluid. The method comprises outputting a potential through the laterally deflectable member upon lateral deformation due to an external force application caused by displacement of the laterally deflectable member and the passive member relative to the sidewalls of the first cavity.

The passive element is rigidly connected to the laterally deflectable element. Due to the lower mass of the passive element compared to the laterally deflectable element, higher accelerations can be achieved especially during changes in direction of the lateral movement of the system formed by the passive element as well as the laterally deflectable element, so that the system can achieve more constant velocities over the deflection range. This allows higher resonant frequencies for lateral motion and allows interaction with larger amounts of ambient fluid. The system formed by the passive element as well as the laterally deflectable element also allows large respective volumes for the first and second sub-cavities, so that only a comparatively small (unwanted) electrical capacitance loading occurs.

FIGURE SHORT DESCRIPTION

Figure 2:
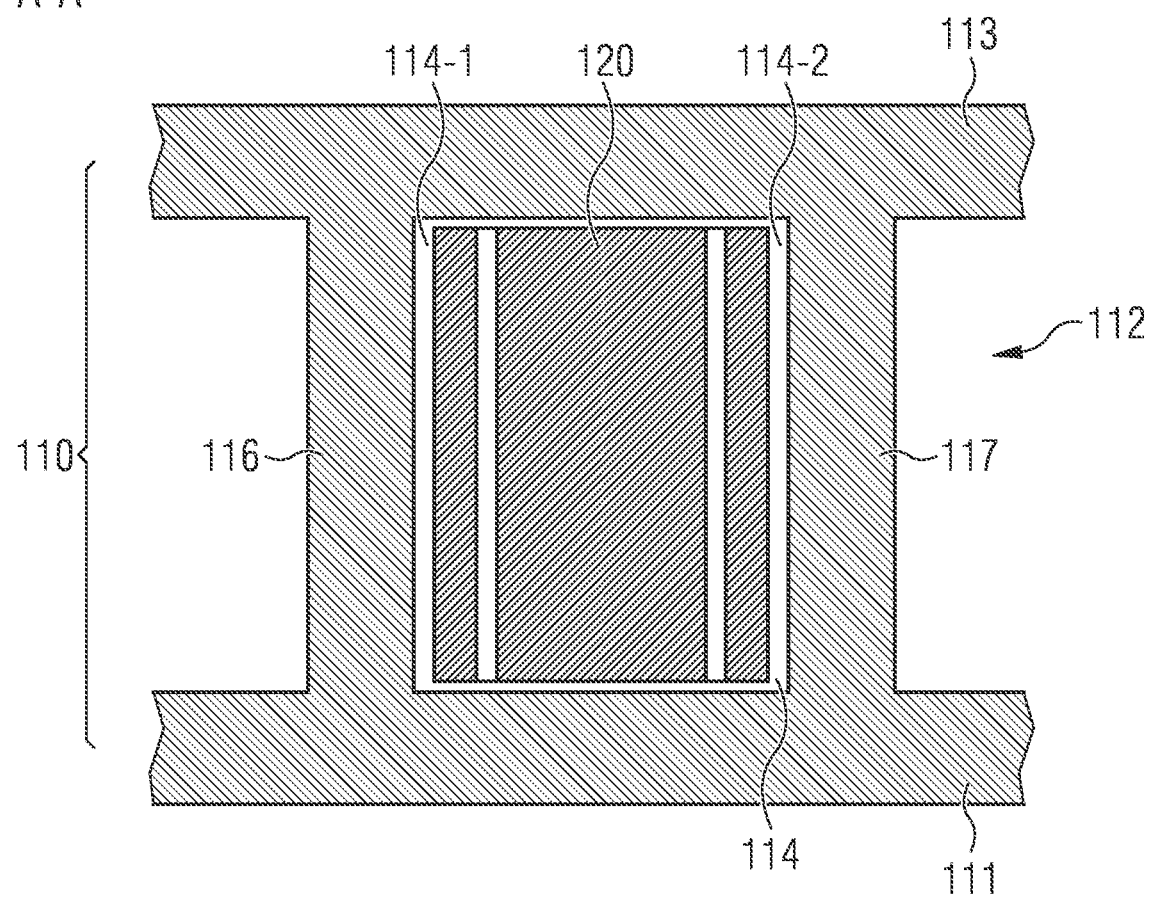
Figure 3:
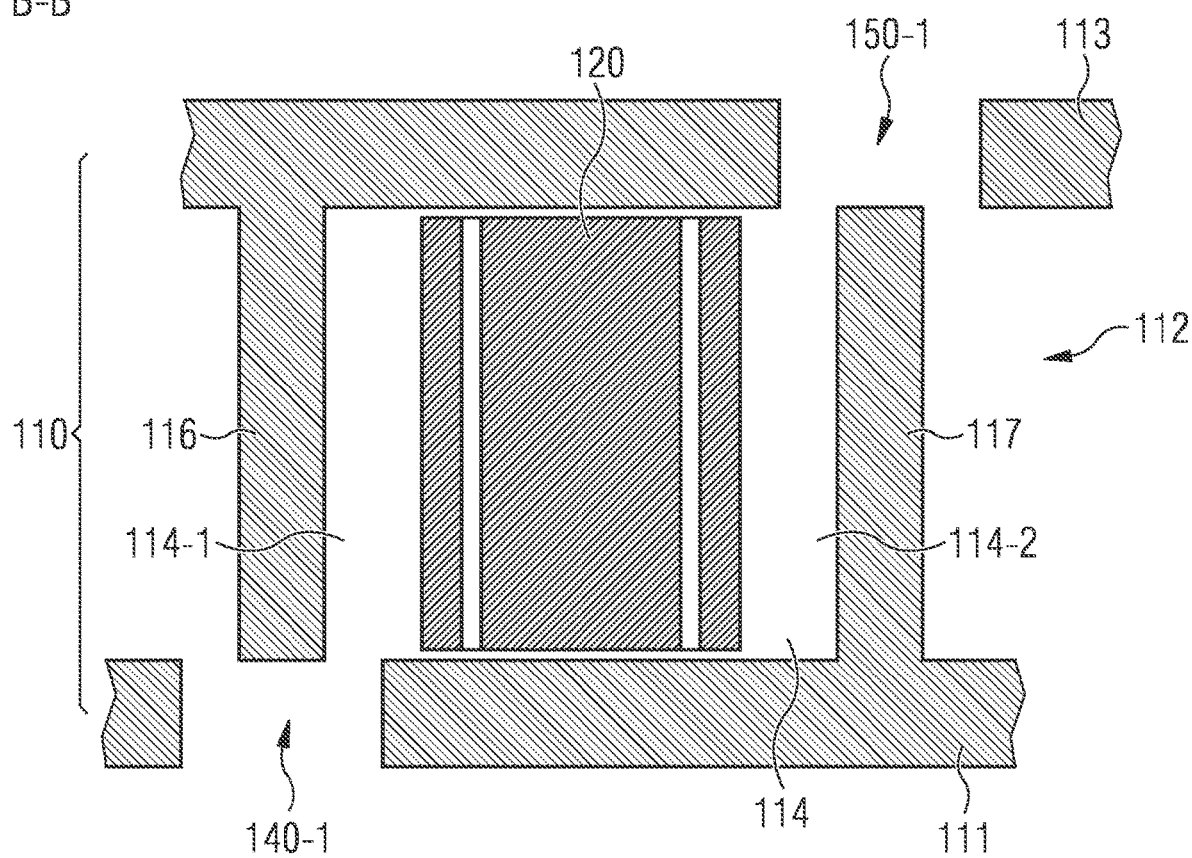
Figure 4:
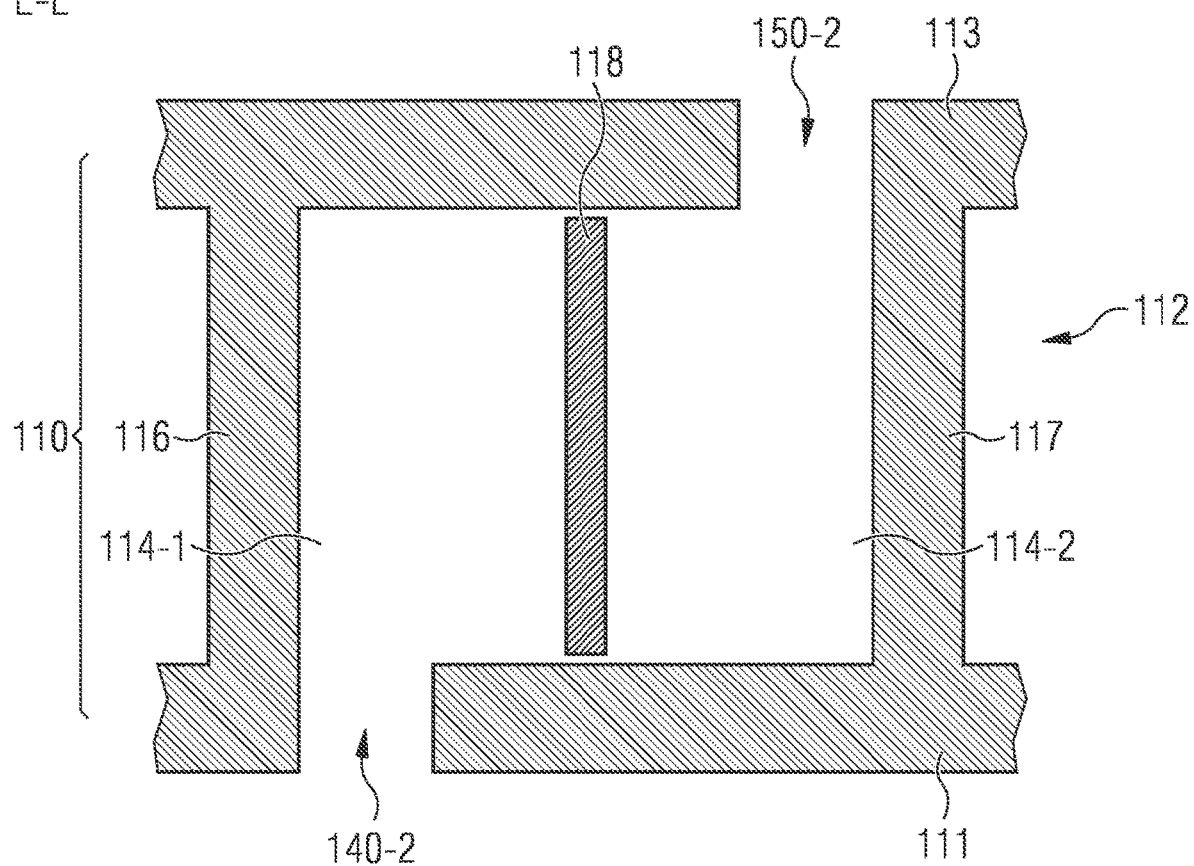
Figure 5:
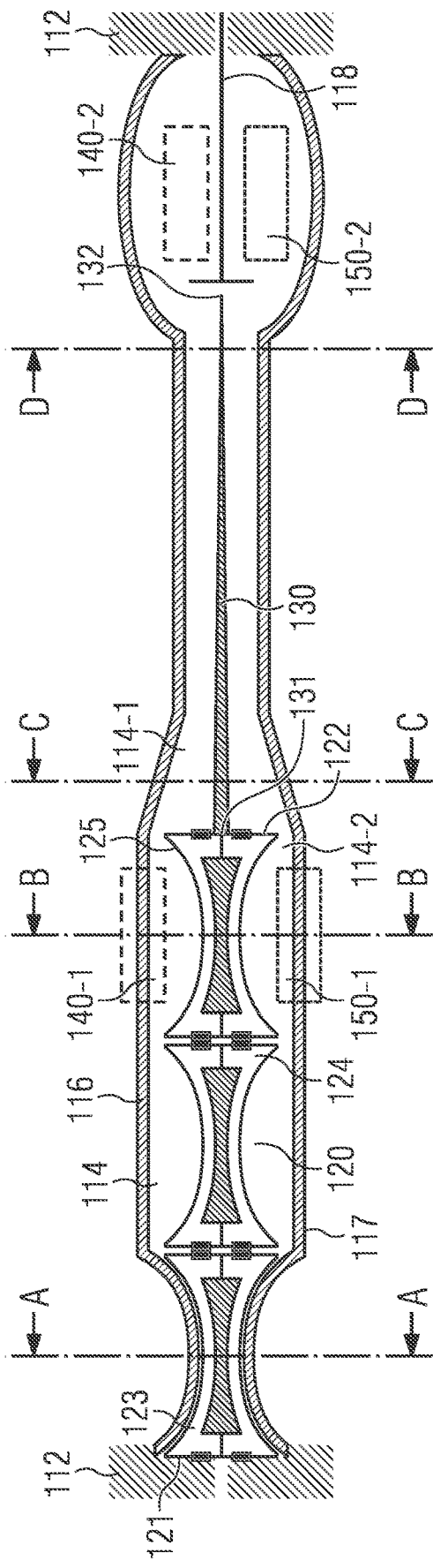
Figure 6:
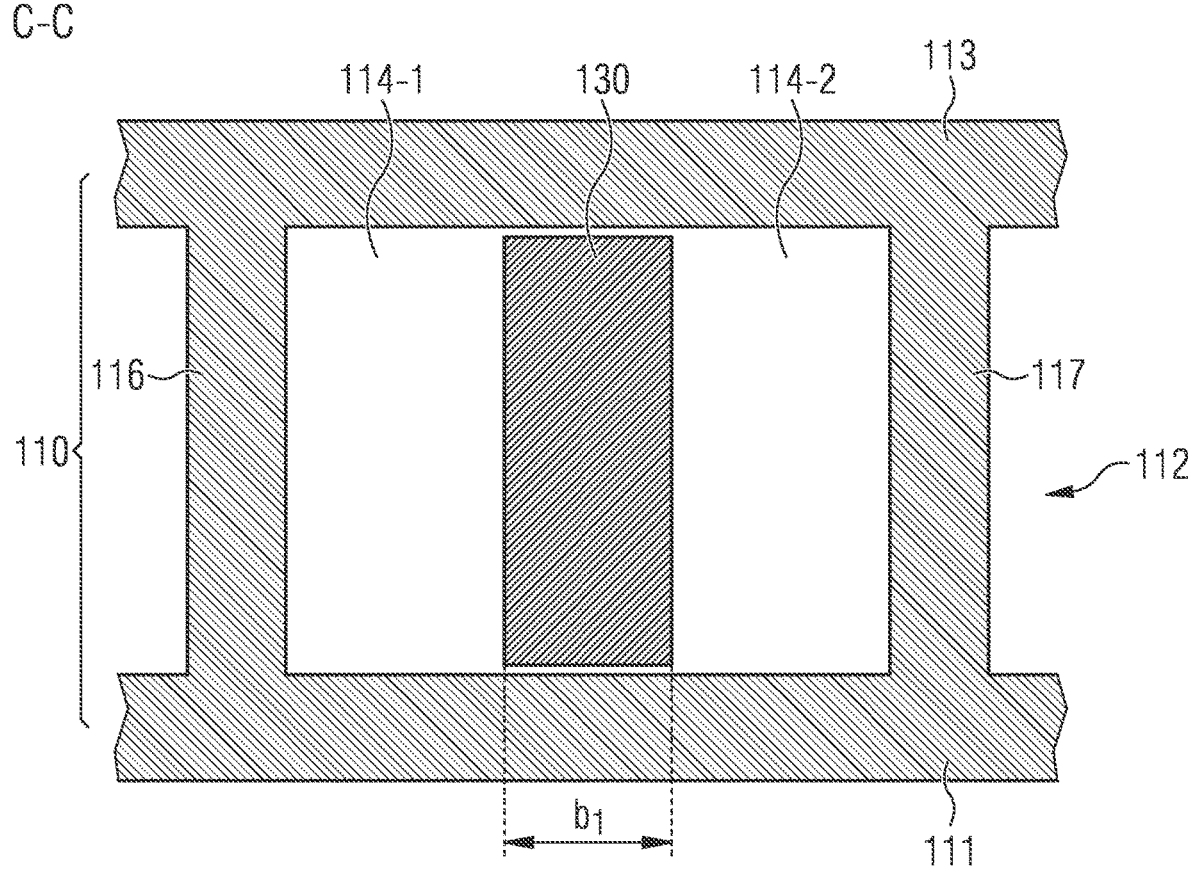
Figure 7:
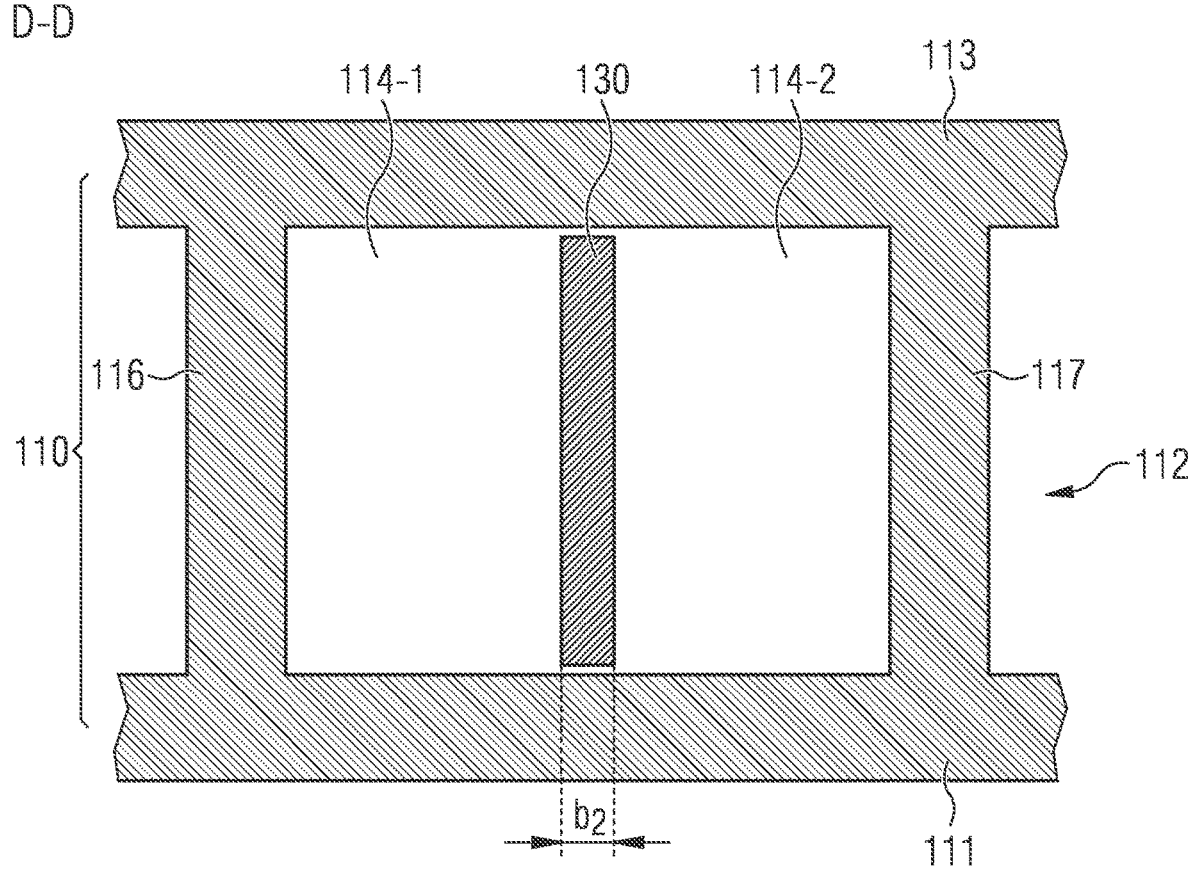
Figure 8:
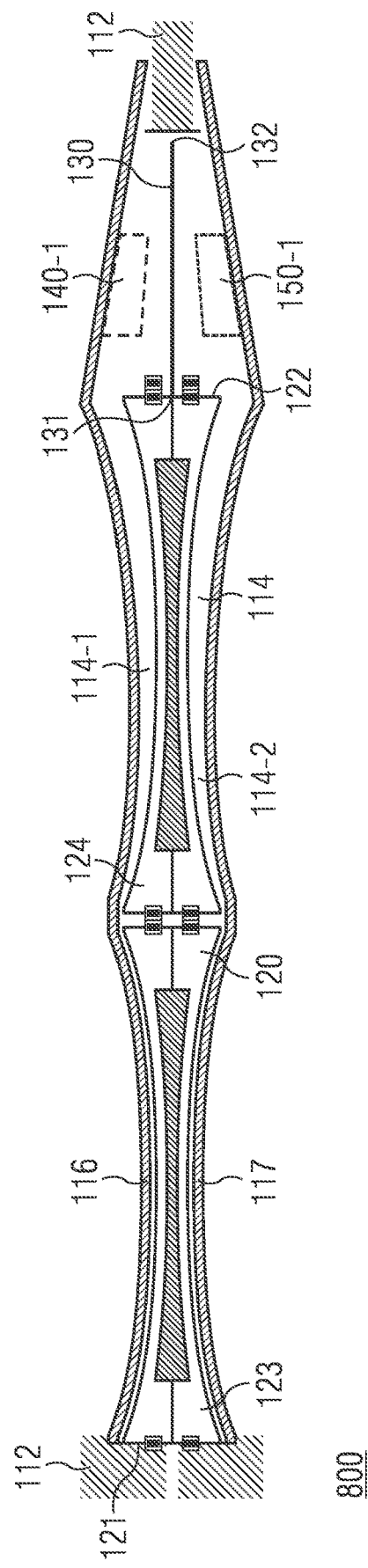
Figure 10:
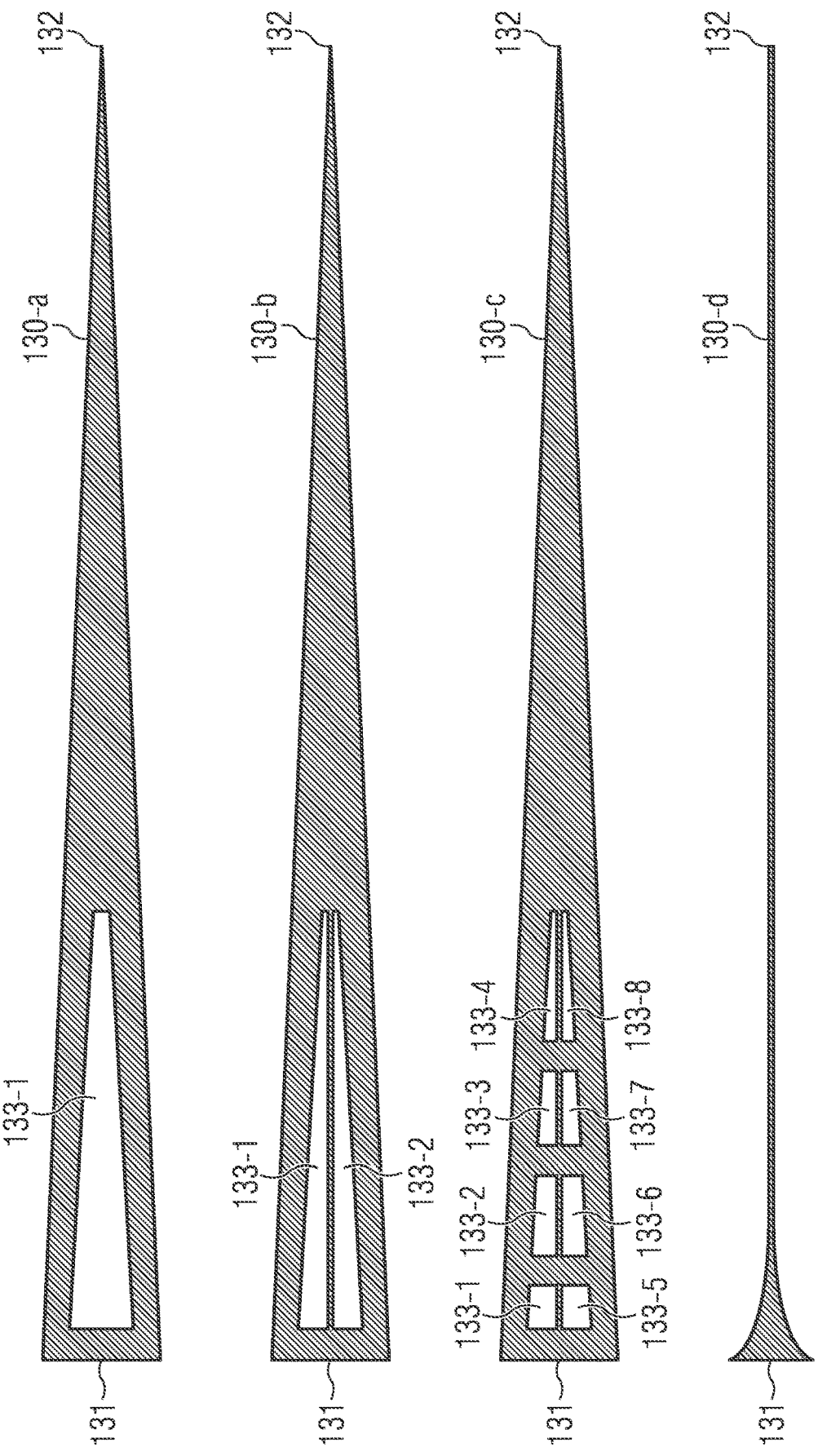
Figure 11:
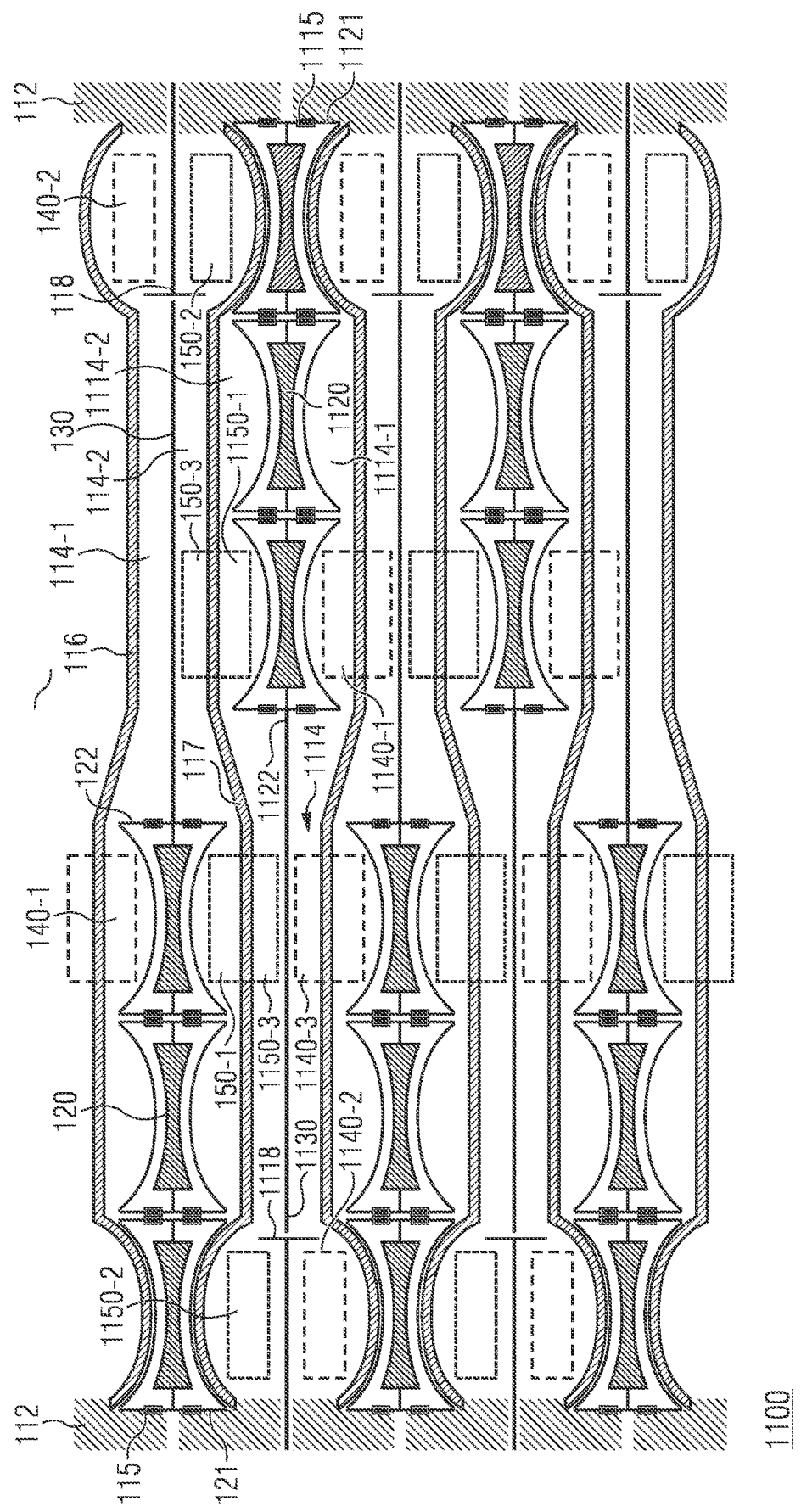
Figure 12:
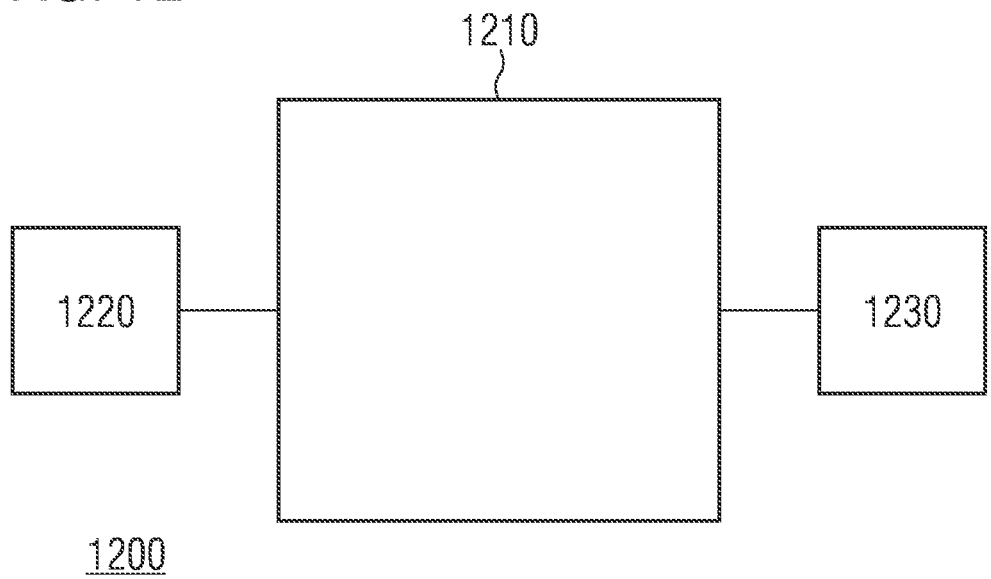
Figure 13:
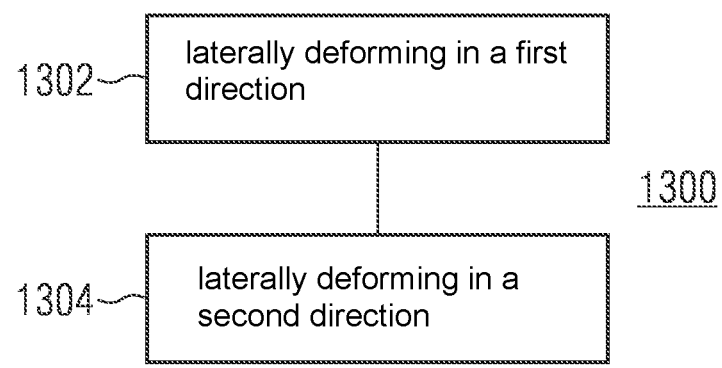
Figure 14:
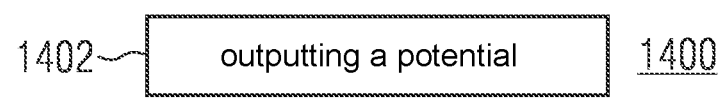

Some examples of devices and/or methods are explained in more detail below with reference to the accompanying figures by way of example only. It show:

FIG. 1 a top view of a first embodiment of a MEMS device;

FIG. 2 a sectional view along sectional axis A-A through the first embodiment of the MEMS device;

FIG. 3 a sectional view along the sectional axis B-B through the first embodiment of the MEMS device;

FIG. 4 a sectional view along the sectional axis E-E through the first embodiment of the MEMS device;

FIG. 5 a top view of a second embodiment of a MEMS device;

FIG. 6 a sectional view along the sectional axis C-C through the second embodiment of the MEMS device;

FIG. 7 a sectional view along the sectional axis D-D through the second embodiment of the MEMS device;

FIG. 8 a top view of a third embodiment of a MEMS device;

FIGS. 9 and 10 embodiments of the passive element;

FIG. 11 a top view of a fourth embodiment of a MEMS device;

FIG. 12 an embodiment example of an assembly with at least one MEMS component;

FIG. 13, a flowchart of a first embodiment of a method of operating a MEMS device; and FIG. 14 is a flowchart of a second embodiment of a method for operating a MEMS device.

DESCRIPTION

Various examples are now described in more detail with reference to the accompanying figures, in which some examples are shown. In the figures, the thicknesses of lines, layers, and/or areas may be exaggerated for clarity.

Accordingly, while further examples of various modifications and alternative forms are suitable, some specific examples thereof are shown in the figures and are described in detail below. However, this detailed description does not limit further examples to the particular forms described. Other examples may cover any modifications, correspondences, and alternatives that fall within the scope of the revelation. Throughout the description of the figures, the same or similar reference signs refer to the same or similar elements that, when compared to each other, may be identical or implemented in a modified form while providing the same or similar function.

It is understood that when one element is referred to as being "connected" or "coupled" to another element, the elements may be connected or coupled directly, or through one or more intermediate elements. When two elements A and B are combined using an "or", this is to be understood as disclosing all possible combinations, i.e., only A, only B, and A and B, unless explicitly or implicitly defined otherwise. An alternative wording for the same combinations is "at least one of A and B" or "A and/or B". The same applies, mutatis mutandis, to combinations of more than two elements.

The terminology used here to describe specific examples is not intended to be limiting for further examples. If a singular form, e.g. "one, one" and "the, the, the" is used and the use of only a single element is neither explicitly nor implicitly defined as mandatory, further examples may also use plural elements to implement the same function. If a function is described below as being implemented using multiple elements, further examples may implement the same function using a single element or processing entity. It is further understood that the terms "includes," "comprising," "having," and/or "comprising," when used, specify the presence of the specified features, integers, steps, operations, processes, elements, components, and/or a group thereof, but do not exclude the presence or addition of one or more other features, integers, steps, operations, processes, elements, components, and/or a group thereof.

Unless otherwise defined, all terms (including technical and scientific terms) are used herein in their ordinary meaning in the field to which examples belong.

FIG. 1 shows a top view of a first MEMS device 100. In particular, FIG. 1 shows a top view of a second layer 112 of a layer stack 110 from which the MEMS device 100 is constructed or formed. The structure of the layer stack 110 can be seen in FIG. 2, which shows a sectional view of the MEMS device 100 along the sectional line A-A indicated in FIG. 1.

It can be seen from FIG. 2 that the stack of layers 110 includes at least a first layer 111, the second layer 112, and a third layer 113. The second layer 112 is formed between the first layer 111 and the third layer 113. At least one first cavity 114 is formed in the second layer 112 (which can also be understood as a device layer, devicelayer or devicewafer), in which the further elements of the MEMS device 100 are arranged. The second layer 112 can therefore also be understood as a substrate layer. Optionally, additional cavities may be formed in the second layer 112.

The first layer 111 serves as a bottom layer for the second layer 112 (and can also be understood as a handling wafer). The third layer 113 serves as a lid layer for the second layer 112 (and can also be understood as a lid wafer). The first layer 111 and the third layer 113 bound the first cavity 114 along the thickness direction of the layer stack 110.

The layers 111 to 113 may comprise electrically conductive materials such as doped semiconductor materials (e.g., doped silicon) or metal materials. Further, layers 111 to 113 may have coated surfaces (e.g., metal on undoped silicon or polymers). The layer-by-layer arrangement of electrically conductive layers enables simple design or structuring, since active elements (e.g. electrodes) as well as passive elements can be formed by selectively dissolving out material from the respective layer. Similarly, layers 111 to 113 may comprise electrically non-conductive materials. The electrically non-conductive materials can be introduced into one of the layers 111 to 113 by means of a deposition process, for example.

For example, the first layer 111, the second layer 112, and the third layer 113 may each be a wafer. The individual wafers are each bonded together in pairs via interlocking processes (e.g., bonding) to form the layer stack 110 with the sequence of layers described above.

Accordingly, the first cavity 114 may be formed as an acoustically sealed interstitial space in the MEMS device 100.

A laterally deflectable member 120 is disposed in the first cavity 114, having an end 121 connected to a sidewall 115 of the first cavity 114 and a free end (or a freely movable end) 122. In other words: The laterally deflectable element 120 is unilaterally connected to the surrounding substrate. In this context, the term "laterally deflectable" should be understood to mean that the laterally deflectable element 120 is capable of in-plane motion of the second layer 112, i.e., in-plane motion. In other words: The laterally deflectable member 120 may move within the plane of the second layer 112, but not vertically with respect to the plane of the second layer 112 (i.e., out of the plane of the second layer 112).

The laterally deflectable element 120 may be of various designs or structures. Regardless of the specific structure of the laterally deflectable element 120, the element 120 is configured to deform laterally when a first potential (e.g., a first voltage signal as a drive signal) is applied and/or to output a second potential (e.g., a second voltage signal as an evaluation signal) when deformed laterally due to the application of an external force. In other words: The laterally deflectable element 120 is configured to provide a force via a movement or deformation in response to an actuation (i.e., to act as an actuator) and/or to sense a force via deformation (i.e., to act as a sensor). For example, the laterally deflectable element 120 may be configured as an electromechanical transducer, piezoelectric transducer, magnetostrictive transducer, thermomechanical transducer, or a combination thereof to convert the respective energy form or potential into mechanical energy and vice versa. Based on a respective applied potential, a corresponding deformation of the laterally deflectable element 120 in the plane of the second layer 112 can thus be provided or, in the case of lateral deformation due to an external force applied by the laterally deflectable element 120, a corresponding potential can be provided.

The in FIGS. 1 and 2, the laterally deflectable member 120 shown is configured as an electrostatic transducer and includes opposing first, second, and third deflectable and laterally deformable sub-elements 123, 124, and 125, respectively, that are spaced apart and electrically interconnected. The laterally deformable subelements 123, 124 and 125 each have a concave curved shape. In other words: In FIG. 1, the laterally deflectable element 120 is configured as a three-cell balanced element. In the simplest case, each of the laterally deformable sub-elements 123, 124 and 125 has a three-layer structure with two geometrically different electrode layers, which are connected to each other via a non-conductive layer, which may be interrupted. When a potential is applied between the at least two electrode layers, an electric field is applied, as a result of which the electrode layers deform laterally (e.g. by changing their length). Due to the mechanical fixation of the laterally deflectable element 120 to the side wall 115 of the cavity 114, the degrees of freedom of the resulting deformation are limited, so that a deformation (curvature or deflection) occurs in the plane of the second layer 112. The use of three laterally deformable sub-elements 123, 124 and 125 each for the laterally deflectable element 120 enables a high and adjustable linearity of the laterally deflectable element 120.

Deflectable elements, and in particular laterally deflectable elements comprising at least a first electrode layer and a second electrode layer between which a non-conductive layer is formed, are also known as nanoscopic electrostatic drives (NEDs). Examples of embodiments of NEDs are described in patent applications WO 2012/095185 A1, WO 2016/202790 A2 and DE 10 215/206 774 A1 of the Fraunhofer-Gesellschaft zur Förderung der angewandten Wissenschaften, the contents of which are hereby incorporated herein. Lateral NEDs (L-NEDs) deform laterally upon application of a first voltage signal to the first electrode layer and the second electrode layer. Furthermore, L-NEDs generate a second voltage signal at the first electrode layer and the second electrode layer when deformed laterally due to an external force application. Thus, according to some embodiments, the laterally deflectable element 120 may be a NED.

As will be apparent from further embodiments, the shape of the laterally deflectable member 120 is not limited to the concave curved shape shown in FIG. 1. In principle, the shape of the laterally deflectable element 120 may be arbitrary (e.g., beam-like, roof-like, etc.). For example, the laterally deflectable element 120 may alternatively be a two-cell balanced element or a beam-shaped element constructed of at least two spaced-apart electrodes.

A passive member 130 is rigidly (i.e., fixed or non-movable or non-elastic) tethered to the free end 122 of the laterally deflectable member 120 to follow a movement of the laterally deflectable member 120. Unlike the laterally deflectable element 120, the passive element 130 cannot deform and is "passive" in this respect. The passive element 130 may be formed from a variety of materials. For example, the passive element 130 may be formed from the same material as the second layer 112.

Two possible lateral deflection ranges of the passive element 130 are indicated in FIG. 1. First, a deflection region 135 for a quasi-static excitation of the laterally deflectable member 120 (i.e., for a quasi-static case) is shown in FIG. 1, and second, a deflection region 136 for a resonant excitation of the laterally deflectable member 120 (i.e., for a resonant case) is shown in FIG. 1.

According to embodiments, a stiffness of the passive element 130 is greater than or equal to a stiffness of the laterally deflectable element 120. In other words: The stiffness of the passive element 130 is at least comparable to that of the laterally deflectable element 120.

Laterally, the first cavity 114 is further bounded by two additional side walls 116 and 117. The further side walls 116 and 117 may be construed as bordering the first cavity 114. The laterally deflectable element 120 as well as the passive element 130 each extend along their longitudinal extent between the two further side walls 116 and 117. As can be seen in particular from the left part of FIG. 1, the respective courses of the further side walls 116 and 117 are adapted at least in part to an outer contour of the laterally deflectable element 120.

A T-shaped partition 118 is further formed in the first cavity 114. The partition 118, together with the laterally deflectable member 120 and the passive member 130, divides the first cavity 114 into a first sub-cavity 114-1 and a second sub-cavity 114-2. A gap is formed between the partition 118 and the free end 132 of the passive element 130 to allow movement of the passive element 130 relative to the partition 118. However, the gap is so small that a (significant) volume flow of the ambient fluid through the gap is not possible. In other words: A (small) clearance is formed between the partition 118 and the free end 132 of the passive element 130, the dimensions of which are so small that no (significant) volume flow is possible through the clearance between the adjacent sub-cavities 114-1 and 114-2. For example, the distance between that of the partition 118 and the free end 132 of the passive element 130 may be less than 10 μm, 5 μm, or 3 μm.

Each of the sub-cavities 114-1 and 114-2 is in contact with an ambient fluid (e.g., a gas or liquid) surrounding the MEMS device 100 via at least one respective opening. The first sub-cavity 114-1 is in contact with the ambient fluid of the MEMS device 100 via at least a first opening 140-1. The second sub-cavity 114-2 is in contact with the ambient fluid of the MEMS device 100 via at least a second opening 150-1. In the MEMS device 100 shown in FIG. 1, the first subcavity 114-1 is in contact with the ambient fluid of the MEMS device 100 via two first openings 140-1 and 140-2. One of the two first openings, namely the first opening 140-1 is disposed in a region of the first sub-cavity 114-1 in which the laterally deflectable member 120 extends. The other of the two first openings, namely the first opening 140-2, is disposed in a different region thereof of the first sub-cavity 114-1. In the embodiment shown in FIG. 1, the first opening 140-2 is located in the region of the partition 118 at the free end 132 of the passive element 130. Equivalently, the second sub-cavity 114-2 is in contact with the ambient fluid of the MEMS device 100 via two second openings 150-1 and 150-2. It should be noted that the number of the first or openings can be freely selected. For example, n=1, 2, 3 or more openings can be provided for each of the sub-cavities. Also, the placement of the opening can be freely chosen, in particular different from the positions shown in FIG. 1 (e.g. in the area of the free end 132 of the passive element 130).

In this case, the at least one first opening 140-1 is formed in a different layer of the first layer 111 and the third layer 113 than the at least one second opening 150-1. This can be seen, for example, in FIG. 3 and FIG. 4, each of which shows a sectional view of the MEMS device 100 along the sectional lines B-B and E-E indicated in FIG. 1. In the embodiment example shown in FIG. 3 and FIG. 4, the first openings 140-1 and 140-2 are formed in the first layer 111, while the second openings 150-1 and 150-2 are formed in the third layer 113. In this way, an acoustic short circuit between adjacent sub-cavities of the first cavity 114 can be avoided. It should be noted that the first openings 140-1 and 140-2 may alternatively be formed in the third layer 113, and the second openings 150-1 and 150-2 may correspondingly be formed in the first layer 111.

The at least one first opening and the at least one second opening are thereby arranged in such a way that the laterally deflectable element 120 and the passive element 130 cannot cover the openings even at maximum lateral deflection, in order to avoid an acoustic short circuit of the two sub-cavities 114-1 and 114-2. There is (substantially) no exchange of fluid between the first sub-cavity 114-1 and the second sub-cavity 114-2 due to the partitioning of the first cavity 114 by the laterally deflectable member 120, the passive member 130, and the partition 118.

Lateral movement of the laterally deflectable element 120 and the passive element 130 can be used to change the volumes of the sub-cavities 114-1 and 114-2. The variable volume subcavities 114-1 and 114-2 are used to interact with the ambient fluid. Pressure equalization in the sub-cavities 114-1 and 114-2 occurs via the at least one first opening 140-1 and the at least one second opening 150-1 when there is a change in volume.

As discussed above, the laterally deflectable member 120 is configured to laterally deform upon application of a first potential such that the laterally deflectable member 120 and the passive member 130 move relative to the further sidewalls 116 and 117 of the first cavity 114 to alternately decrease and increase the volume of the first sub-cavity 114-1 and conversely alternately increase and decrease the volume of the second sub-cavity 114-2 to affect the ambient fluid. Via the openings 140-1 and 140-2 and 150-1 and 150-2, respectively, the change in volumes of the subcavities 114-1 and 114-2 affect the ambient fluid present in the environment of the MEMS device 100, thereby affecting the same. Accordingly, the MEMS device 100 acts as an actuator.

Conversely, the laterally deflectable member 120 and the passive member 130 can move laterally with respect to the further sidewalls 116 and 117 of the first cavity 114 to adjust volumes of the first sub-cavity 114-1 and the second sub-cavity 114-2, depending on the ambient fluid, while deforming the laterally deflectable member 120. For example, depending on pressure conditions or pressure gradients in the ambient fluid, the volume of the first sub-cavity 114-1 may be reduced and the volume of the second sub-cavity 114-2 may be increased so that the laterally deflectable element 120 and the passive element 130 are laterally displaced relative to the further sidewalls 116 and 117 of the first cavity 114, and the laterally deflectable element 120 is deformed accordingly. As discussed above, the laterally deflectable member 120 is configured to output a second potential upon lateral deformation due to the application of an external force by the displacement of the laterally deflectable member 120 and the passive member 130 relative to the further sidewalls 116 and 117 of the first cavity 114.

For example, where the laterally deflectable element 120 comprises a first electrode layer and a second electrode layer with a non-conductive layer formed therebetween as described above, the laterally deflectable element 120 may be correspondingly configured to laterally deform upon application of a first voltage signal (as an example of a first potential) to the first electrode layer and the second electrode layer, and/or to generate a second voltage signal (as an example of a second potential) at the first electrode layer and the second electrode layer upon lateral deformation due to an external force application.

The combination of laterally deflectable element 120 and passive element 130 collectively forms a large area for interaction with the surrounding fluid. The MEMS device 100 can thus provide an increased fluidic effective area. In this regard, the MEMS device 100 can be used to influence the ambient fluid, i.e., as an actuator, or to measure the ambient fluid, i.e., as a sensor. Due to the above-described embodiment, the passive element 130 has a comparatively low mass, so that high accelerations can be achieved especially during changes in direction of the lateral movement and the proportion of the deflection range which the transducer crosses at a more constant speed increases accordingly within the deflection range of the transducer. This has a positive effect on the resonant frequencies achievable for lateral movement. Further, this allows interaction with a greater amount of ambient fluid.

The small dimensions of passive element 130 compared to laterally deflectable element 120 allow for large volumes of sub-cavities 114-1 and 114-2. In this way, high packing densities can be achieved with a large fluidic effective area. At the same time, this advantageously reduces the capacitance loading of the MEMS component or transducer system. (i.e. the electrical capacitance held by a specific chip surface of the MEMS device).

An extension of the passive element 130 along a thickness direction of the second layer 112 is, in some embodiments, the same as an extension of the laterally deflectable element 120 along the thickness direction of the second layer 112. In other words: The height of the passive element 130 may be equal to a height of the laterally deflectable element 120. Alternatively, the extension of the passive element 130 along the thickness direction of the second layer 112 may be at least partially less than the extension of the laterally deflectable element 120 along the thickness direction of the second layer 112. For example, the extension of the passive element 130 along the thickness direction of the second layer 112 may be, at least in part, 5 to 10 µm less than the extension of the laterally deflectable element 120 along the thickness direction of the second layer 112. A lower height of the passive element 130 compared to the laterally deflectable element 120 may allow the fluidic load to be matched to the performance of the laterally deflectable element 120. Similarly, the height can be used to match the fluid stiffness to the stiffness of the laterally deflectable element 120. This could alternatively be done by varying the longitudinal extent of the passive element 130. Varying the height extension of the passive element 130 has the advantage over varying the length extension that the fill factor of the first cavity 114 is maintained (i.e., the volume of the first cavity does not need to be changed).

The extensions of the passive element 130 as well as of the laterally deflectable element 120 along the thickness direction of the second layer 112 are selected in such a way that in each case only a small gap remains between the passive element 130 or the laterally deflectable element 120 and the first layer 111 (i.e. the handling wafer) or the third layer 113 (i.e. the lid wafer). In particular, the extensions of the passive element 130 as well as of the laterally deflectable element 120 along the thickness direction of the second layer 112 are selected such that no (significant) volume flow is possible between the adjacent sub-cavities 114-1 and 114-2 due to the free space between the passive element 130 or the laterally deflectable element 120 and the first layer 111 or the third layer 113. For example, the distance between the passive element 130 or the laterally deflectable element 120 and the first layer 111 or the third layer 113 may be less than 10 µm, 5 µm, or 3 µm. Accordingly, an acoustic short circuit between subcavities 114-1 and 114-2 can be avoided.

In particular, as shown in FIG. 1, a cross-section of the passive element 130 along its longitudinal extent is smaller than a cross-section of the laterally deflectable element 120 along its longitudinal extent. In other words: In the direction of movement of the laterally deflectable element 120 (i.e., in the lateral direction), the geometric spread of the passive element 130 is (significantly) less than the geometric spread of the laterally deflectable element 120.

The cross-section of the passive element 130 along its longitudinal extent may be constant (i.e., unchanged) as shown in FIG. 1. Alternatively, the cross-section of the passive element 130 may change along its longitudinal extent. This is shown in FIG. 5. In the MEMS device 500 shown in FIG. 5, the cross-section of the passive element 130 decreases from the end 131 of the passive element 130 connected to the laterally deflectable element 120 to a free end 132 of the passive element 130, but otherwise the MEMS device 500 is constructed identically to the MEMS device 100. In other words: The passive element 130 tapers from the end 131 connected to the laterally deflectable element 120 toward the free end 132 of the passive element 130. Thus, the junction of the passive element 130 with the laterally deflectable element 120 has the largest geometric dimensions, while the free-swinging end 132 of the passive element 130 has the smallest geometric dimensions. For example, the passive element 130 may taper in the plane of the second layer 112, with the pointed end of the passive element 130 being the free end 132 of the passive element 130. This is further evident from FIG. 6 and FIG. 7, each of which illustrates a sectional view of the MEMS device 500 along the sectional lines C-C and D-D indicated in FIG. 5. While the width (i.e., lateral extent) of the passive element 130 at the intersection line C-C is still b1, the width of the passive element 130 at the intersection line D-D, which is closer to the free end 132 of the passive element 130 than the intersection line C-C, is now only b2 (where b2<b1). The greater width of the passive element 130 in the connection area between the passive element 130 and the laterally deflectable element 120 compared to the width at the free end 132 of the passive element 130 allows for a homogeneous stress transfer between the free end 122 of the laterally deflectable element 120 and the passive element 130. The stresses resulting from the resistance of the passive element 130 to the ambient fluid and the inertia of the passive element 130 as the acceleration changes can be transmitted homogeneously into the laterally deflectable element 120 due to the increased width at the end 131 of the passive element 130. The reduced mass or inertia of passive element 130 due to the taper of passive element 130 improves the dynamic performance of the transducer system formed by passive element 130 and laterally deflectable element 120.

Regardless of whether the cross-section of the passive element 130 changes along the longitudinal extent of the passive element 130 or is constant, the ratio of the longitudinal extent of the passive element 130 to its lateral extent is greater than, for example, 10:1, 20:1, 30:1, 40:1, or 50:1. In other words: The passive element 130 is considerably longer than it is wide and can therefore also be understood as a "rod-shaped" element.

The longitudinal extent of passive element 130 may be selected depending on the desired dynamic behavior of the system comprising passive element 130 and laterally deflectable element 120. The achievable resonant frequency of the system consisting of passive element 130 and laterally deflectable element 120 can be adjusted by selecting the length of passive element 130. It should be noted that the achievable resonant frequency decreases with increasing length of the passive element 130. For example, a longitudinal extent of the passive element may be between 20% and 160%, particularly between 30% and 50% or between 60% and 100% or even 80%, of a longitudinal extent of the laterally deflectable element 120.

As already indicated several times in the description of the individual elements of the MEMS devices 100 and 500, the individual elements of a MEMS device according to the proposed architecture can be modified in many ways compared to the MEMS devices 100 and 500 shown in FIG. 1 and FIG. 5. Therefore, some other MEMS devices according to the proposed architecture are described in more detail below, essentially highlighting the differences from the MEMS devices 100 and 500 described in detail above.

FIG. 8 shows a MEMS device 800 with a laterally deflectable element 120 of different design compared to MEMS devices 100 and 500. While the laterally deflectable element 120 of the MEMS devices 100 and 500 are each formed of three sub-elements having a concavely curved shape, the laterally deflectable element 120 of the MEMS device 800 comprises only two sub-elements having a concavely curved shape. In other words: The laterally deflectable element 120 is a two-cell balanced element in FIG. 8. Further, in the embodiment, the longitudinal extent of the passive element 130 is less than the longitudinal extent of the laterally deflectable element 120. Similarly, the MEMS device 800 does not have a partition.

The embodiment of MEMS device 800 is advantageous for confined spaces when longer laterally deflectable elements with higher numbers of cells cannot be used. The available surface for interception (interaction) with the surrounding fluid is thus utilized to the maximum.

In FIGS. 9 and 10, it is further shown how the passive element 130 can be adapted to the respective situation via corresponding geometries. FIG. 9 shows a sectional view through the passive element 130 (e.g., along one of the section lines C-C and D-D in FIG. 5) to suggest various possible cross-sections for the passive element 130. For example, the passive element 130 may have a beam-shaped or rectangular cross-section (see top left), a wedge-shaped cross-section (see top right), a concave cross-section (see bottom left), or an oval cross-section (see bottom right).

FIG. 10 further shows a top view of the passive element to indicate further embodiments for the passive element. In particular, FIG. 10 shows several embodiments of the passive element with improved lightweight potential. In the embodiments 130-a, 130b, and 130-c shown in FIG. 10, at least one cavity 133-1, . . . , 133-8 is formed in each passive element. By means of the cavity or cavities, an improved mass-to-rigidity ratio can be achieved at the end 131 of the passive element connected to the laterally deflectable element 120. For example, one or more etching processes may be used to remove material from the passive element to form the cavity or cavities 133-1, . . . , 133-8.

As indicated in embodiment 130-d shown in FIG. 10, an improved mass-to-rigidity ratio can also be achieved via an optimized geometry or outer contour in the region of the end 131 of the passive element connected to the laterally deflectable element 120.

In FIG. 11, a MEMS device 1100 is shown in which a plurality of cavities having the structure described above are formed in the second layer 112. Although five cavities are shown in FIG. 11, it should be noted that a MEMS device according to the invention can have any other plurality of cavities. For example, a MEMS device according to the invention may also have 2, 3, 4, 6, 10, 20 or more of the cavities described above. As can be seen from FIG. 11, the individual cavities are arranged alternately in the second layer 112, so that adjacent cavities are arranged rotated 180° with respect to each other and each have a common side wall (in alternative embodiments, the cavities can also be arranged equisinned, i.e. not rotated with respect to each other). In other words: The transducer systems disposed in the cavities are arranged adjacent to each other along a first spatial direction and extend (longitudinally) substantially along a second spatial direction that is perpendicular to the first spatial direction. Here, the transducer systems are alternately suspended on opposite sides of the surrounding substrate of the second layer 112. This will be explicitly explained again below with reference to the first cavity 114 and the second cavity 1114, which are adjacent to each other.

The first cavity 114 is substantially as described above and also includes a third second opening 150-3. Reference is therefore made to the above statements.

Accordingly, another laterally deflectable member 1120 having an end 1121 connected to a side wall 1115 of the second cavity 1114 and a free end 1122 is formed in the second cavity 1114. In the embodiment example of FIG. 11, the further laterally deflectable element 1120 is formed identically to the laterally deflectable element 120. In alternative embodiments, the further laterally deflectable element 1120 and the laterally deflectable element 120 may also be formed differently (for example, have a different geometry or a different number of sub-elements).

The sidewall 115 of the first cavity 114, to which the laterally deflectable member 120 is attached, and the sidewall 1115 of the second cavity 1114, to which the further laterally deflectable member 1120 is attached, are opposite each other. The first cavity 114 and the second cavity 1114 are bounded by the common further sidewall 117, which extends along the longitudinal extent of the laterally deflectable member 120 and along the longitudinal extent of the further laterally deflectable member 1120.

A further passive element 1130 is rigidly connected to the free end 1122 of the further laterally deflectable element 1120 to follow a movement of the further laterally deflectable element 1120. In the embodiment example of FIG. 11, the further passive element 1130 is formed identically to the passive element 130. In alternative embodiments, the further passive element 1130 and the passive element 130 may also be formed differently (for example, have a different geometry or a different length).

Analogous to the above embodiments for the first cavity 114, the further laterally deflectable member 1120 and the further passive member 1120, together with the further partition 1118, divide the second cavity 1114 into a third sub-cavity 1114-1 and a fourth sub-cavity 1114-2.

The adjacent cavities 114 and 1114 are arranged in the MEMS device 1100 such that the respective laterally deflectable element 120 or 1120 faces the passive element 1130 or 130 of the adjacent cavity.

The third subcavity 1114-1 is in contact with the ambient fluid of the MEMS device 1110 via three third openings 1140-1, 1140-2, and 1140-3. Accordingly, the fourth sub-cavity 1114-2 is in contact with the ambient fluid of the MEMS device 1100 via three fourth openings 1150-1, 1150-2, and 1150-3. Analogous to the above explanations for the first and third openings, it should be noted that the number of openings shown in FIG. 11 is exemplary and serves purely for illustration purposes. According to embodiments, any number (n≥1) of openings may be used to bring the third subcavity 1114-1 and the fourth subcavity 1114-2 into contact with the ambient fluid.

Third openings 1140-1, 1140-2, and 1140-3 are again formed in a different layer of first layer 111 and third layer 113 than fourth openings 1150-1, 1150-2, and 1150-3 to avoid an acoustic short between third subcavity 1114-1 and fourth subcavity 1114-2.

In the embodiment example of FIG. 11, the second openings 150-1, 150-2 and 150-3 are formed in the same layer of the first layer and the third layer as the fourth openings 1150-1, 1150-2 and 1150-3. As shown in FIG. 11, the second opening 150-1 and the fourth opening 1150-3 and the second opening 150-3 and the fourth opening 1150-1 each form a contiguous opening. Thus, the second subcavity 114-2 is short-circuited to the adjacent fourth subcavity 1114-2. This is possible because the lateral movement of the further passive member 1130 and the further laterally deflectable member 1120 is opposite to the movement of the passive member 130 and the laterally deflectable member 120, so that the volumes of the second sub-cavity 114-2 and the fourth sub-cavity 1114-2 change in a substantially similar manner. The adjacent cavities 114 and 1114 are thus connected to each other in areas where the respective laterally deflectable element 120 or 1120 faces the passive element 1130 or 130 of the adjacent cavity.

It is further apparent from FIG. 11 that the at least partial matching of the respective trajectories of the further side walls 116 and 117 to the outer contour of the laterally deflectable element 120 allows the volume of the adjacent cavities to be increased in the region of the free end of their respective passive elements. For example, matching the contour of the sidewall 117 to the curved contour of the first cell of the laterally deflectable element 120 allows the volume of the second cavity 1114 to be increased in the region of the free end 1132 of the further passive element 1130 or in the region of the partition 1118 of the second cavity 1114. The laterally deflectable member 120 experiences its least deformation in this region, so that the oval configuration of the sidewall 117 maximizes the volume of the second cavity 1114 in this region. Accordingly, a larger volume of ambient fluid may be interacted with in the second cavity 1114.

The embodiment made for cavities 114 and 1114 apply in an analogous manner to the other cavities of MEMS device 1100.

While the preceding sections have focused on the details of MEMS devices according to the proposed architecture, the following sections will discuss the application of MEMS devices in more detail.

To this end, an assembly 1200 is shown in FIG. 12. Assembly 1200 includes at least one MEMS device 1210 according to the proposed architecture or one of the embodiments described herein. If the assembly 1200 includes a plurality of MEMS devices 1210, the plurality of MEMS devices 1210 may be oriented in substantially any orientation relative to one another. For example, the plurality of MEMS devices 1210 may be formed on a common semiconductor chip or die.

Depending on the type of assembly 1200, the assembly may include a control circuit 1220 and/or a measurement circuit 1230.

The control circuit 1320 is configured to provide at least a first potential (e.g., a first voltage signal, a first magnetic potential, or a first thermal potential) to the laterally deflectable element of the at least one MEMS device 1210 to operate the laterally deflectable element as an actuator to affect the ambient fluid.

The measurement circuit 1330 is configured to measure at least a second potential (e.g., a second voltage signal, a second magnetic potential, or a second thermal potential) of the laterally deflectable element of the at least one MEMS device 1210 to operate the laterally deflectable element as a sensor for the ambient fluid.

If the at least one MEMS device 1210 is to be operated as an actuator, the assembly 1200 includes control circuitry 1220. For example, the assembly 1200 may be a headphone, a speaker, a speaker of a headphone, a speaker of an (ultra-) mobile terminal, or the like, such that the ambient fluid surrounding the at least one MEMS device 1210 is influenced to output a sound signal via the at least one MEMS device 1210. According to further embodiments, the assembly 1200 may also be a fluid pump such that the ambient fluid surrounding the at least one MEMS device 1210 is influenced for fluid transport via the at least one MEMS device 1210.

If the at least one MEMS device 1210 is to be operated as a sensor, the assembly 1200 includes measurement circuitry 1230. For example, the assembly 1200 may be a microphone that provides sensing of the ambient fluid surrounding the at least one MEMS device 1210 via the at least one MEMS device 1210.

If the assembly 1200 includes a plurality of MEMS devices 1210, according to embodiments, a first portion of the plurality of MEMS devices 1210 may operate as actuators and a second portion of the plurality of MEMS devices 1210 may operate as sensors. For example, in this embodiment, the assembly 1200 may be an active noise cancelling headphone.

To again summarize the aspects described above for operating the MEMS devices described herein, FIGS. 13 and 14 still show flowcharts of two methods for operating the MEMS devices described herein.

FIG. 13 shows a flowchart of a first method 1300 for operating a MEMS device described herein. The method 1300 includes laterally deforming 1302 the laterally deflectable member in a first direction by applying a potential (e.g., a voltage signal) to increase a volume of the first subcavity and decrease a volume of the second subcavity during a first time interval to affect the ambient fluid. Further, the method 1300 includes laterally deforming 1304 the laterally deflectable member in an opposite second direction by applying the potential to increase the volume of the second subcavity and decrease the volume of the first subcavity during a second time interval for influencing the ambient fluid.

The method 1300 can provide controlled manipulation of the ambient fluid based on the applied potential. Due to the design of the laterally deflectable element and the passive element in the cavity, the available area of the MEMS device can be used to a high degree for influencing the ambient fluid. Method 1300 can be used to operate the MEMS device as an actuator.

Further details and aspects of the method 1300 are described above in connection with further embodiments (e.g., FIGS. 1 to 10) described. The method 1300 may comprise one or more optional features according to the further embodiments.

FIG. 14 illustrates a flowchart of a second method 1400 for operating a MEMS device described herein, wherein the laterally deflectable element and the passive element can move laterally relative to sidewalls of the first cavity to adjust volumes of the first subcavity and the second subcavity depending on the ambient fluid. The method 1400 includes outputting 1402 a potential (e.g., a voltage signal) through the laterally deflectable member upon lateral deformation due to an external force applied by displacement of the laterally deflectable member and the passive member relative to the sidewalls of the first cavity.

Due to the design of the laterally deflectable element and the passive element in the cavity, the available area of the MEMS device can be used to a high degree for sensing the ambient fluid. Method 1400 can be used to operate the MEMS device as a sensor.

Further details and aspects of the method 1400 are described above in connection with further embodiments (e.g., FIGS. 1 to 10) described. The method 1400 may comprise one or more optional features according to the further embodiments.

Thus, embodiments of the present disclosure relate to, among other things:

A MEMS transducer with increased fluidic effective area consisting of an actuator (active element) and a passive element.

Embodiments in which the actuator is connected to the substrate on one side.

Embodiments in which the passive element is rigidly connected at its freely vibrating end and follows the motion of the actuator.

Embodiments in which the passive element has a stiffness at least comparable to or greater than the actuator.

Embodiments in which the passive element is rod-shaped.

Embodiments in which the passive element has a variable thickness in plan view, having the largest geometric dimensions at the connection point to the actuator and the smallest geometric dimensions at the free vibrating end.

Embodiments in which lateral deformation of the unilaterally clamped bending transducers occurs based on an electrical potential.

Embodiments in which a length of the passive element is 20-160% of the length of the actuator, preferably 60-100%, and more preferably 80%.

Embodiments in which adjacent transducers in a transducer system are arranged to be clamped opposite each other.

Embodiments in which the actuator and passive element are enclosed in a cavity. The cavity is formed by the rim, which is arranged in the substrate plane, as well as the lid and handling wafers. Adjacent transducers share a common boundary. Transducers, each consisting of an actuator and a passive element, divide the cavity into two sub-cavities.

Examples of embodiments in which openings in the lid and handling wafer connect the sub-cavities to the surrounding area. The openings may be located above the common rim so that adjacent subcavities are interconnected.

Furthermore, embodiments relate to a controller that is configured to process an input signal in order to convert corresponding potentials to the electrodes of an actuator, so that potential differences between the electrodes lead to a deformation of the actuator.

The aspects and features described together with one or more of the previously detailed examples and figures may also be combined with one or more of the other examples to substitute for a like feature of the other example, or to additionally introduce the feature into the other example.

Through the description and drawings only the principles of the disclosure are presented. Further, all examples herein are generally intended to be expressly for illustrative purposes only, to assist the reader in understanding the principles of the disclosure and the concepts contributed by the inventors to the advancement of the art. All statements here about principles, aspects and examples of the revelation as well as concrete examples of the same include their correspondences.

Further, the following claims are hereby incorporated by reference in the detailed description, where each claim may stand alone as a separate example. While each claim may stand alone as a separate example, it should be noted that although a dependent claim may refer in the claims to a particular combination with one or more other claims, other examples may also include a combination of the dependent claim with the subject matter of any other dependent or independent claim. Such combinations are explicitly suggested here unless it is stated that a particular combination is not intended. Further, features of a claim for any other independent claim are also intended to be included, even if that claim is not made directly dependent on the independent claim.

The invention claimed is:

1. A MEMS device, comprising:
   a layer stack having at least one second layer formed between a first layer and a third layer, wherein at least one first cavity is formed in the second layer;
   a laterally deflectable element having an end connected to a side wall of the first cavity and a free end; and
   a passive element rigidly connected to the free end of the laterally deflectable element in order to follow a movement of the laterally deflectable element;
      wherein the laterally deflectable element and the passive element divide the first cavity into a first sub-cavity and a second sub-cavity,
      wherein the first sub-cavity is in contact with an ambient fluid of the MEMS device via at least one first opening,
      wherein the second sub-cavity is in contact with the ambient fluid of the MEMS device via at least one second opening, and
      wherein the at least one first opening is formed in another layer of the first layer and the third layer than the at least one second opening.

2. The MEMS device of claim 1, wherein a stiffness of the passive element is greater than or equal to a stiffness of the laterally deflectable element.

3. The MEMS device of claim 1, wherein an extension of the passive element along a thickness direction of the second layer is equal to an extension of the laterally deflectable element along the thickness direction of the second layer.

4. The MEMS device of claim 1, wherein an extension of the passive element along a thickness direction of the second layer is at least partially less than an extension of the laterally deflectable element along the thickness direction of the second layer.

5. The MEMS device of claim 1, wherein a cross-section of the passive element along its lengthwise extension is smaller than a cross-section of the laterally deflectable element along its lengthwise extension.

6. The MEMS device of claim 1, wherein a cross-section of the passive element decreases from an end of the passive element connected to the laterally deflectable element toward a free end of the passive element.

7. The MEMS device of claim 1, wherein at least one hollow space is formed in the passive element.

8. The MEMS device of claim 1, wherein a ratio of a lengthwise extension of the passive element to its lateral extension is greater than 10:1.

9. The MEMS device of claim 1, wherein a lengthwise extension of the passive element is between 20% and 160% of a lengthwise extension of the laterally deflectable element.

10. The MEMS device of claim 1, wherein the first cavity is bounded by two further side walls, wherein the laterally deflectable element extends along its lengthwise extension between the two further side walls, and wherein respective courses of the further side walls are adapted at least partially to an outer contour of the laterally deflectable element.

11. The MEMS device of claim 1, wherein a separating wall is further formed in the first cavity, which, together with the laterally deflectable element and the passive element, divides the first cavity into the first sub-cavity and the second sub-cavity, wherein a gap is formed between the separating wall and a free end of the passive element in order to enable movement of the passive element relative to the separating wall.

12. The MEMS device of claim 1, wherein the first sub-cavity is in contact with the ambient fluid of the MEMS device via two first openings, wherein one of the two first openings is arranged in an area of the first sub-cavity in which the laterally deflectable element extends, and wherein the other one of the two first openings is arranged in an area of the first sub-cavity different therefrom.

13. The MEMS device of claim 1, wherein the laterally deflectable element is configured to laterally deform upon application of a first potential such that the laterally deflectable element and the passive element move relative to side walls of the first cavity in order to alternately decrease and increase a volume of the first sub-cavity and conversely alternately increase and/or decrease a volume of the second sub-cavity to influence the ambient fluid.

14. The MEMS device of claim 1, wherein the laterally deflectable element and the passive element may move laterally relative to side walls of the first cavity in order to adjust volumes of the first sub-cavity and the second sub-cavity depending on the ambient fluid, and wherein the laterally deflectable element is configured to output a second potential upon lateral deformation due to an external force application by the displacement of the laterally deflectable element and the passive element relative to the side walls of the first cavity.

15. The MEMS device of claim 1, wherein the laterally deflectable element comprises a first electrode layer and a second electrode layer between which a non-conducting layer is formed, wherein the laterally deflectable element is configured to:
   laterally deform upon application of a first voltage signal to the first electrode layer and the second electrode layer; and/or
   generate a second voltage signal at the first electrode layer and the second electrode layer upon lateral deformation due to an external force application.

16. The MEMS device of claim 1, further comprising:
   a second cavity formed in the second layer;

a further laterally deflectable element having an end connected to a side wall of the second cavity and a free end;

a further passive element rigidly connected to the free end of the further laterally deflectable element in order to follow a movement of the further laterally deflectable element;

wherein the further laterally deflectable element and the further passive element divide the second cavity into a third sub-cavity and a fourth sub-cavity, wherein the third sub-cavity is in contact with the ambient fluid of the MEMS device via at least one third opening, wherein the fourth sub-cavity is in contact with the ambient fluid of the MEMS device via at least one fourth opening, and wherein the at least one third opening is formed in another layer of the first layer and the third layer than the at least one fourth opening.

17. The MEMS device of claim 16, wherein the side wall of the first cavity and the side wall of the second cavity are opposite each other, the first cavity and the second cavity being adjacent to each other, such that the first cavity and the second cavity are each bounded by a common further side wall extending along a lengthwise extension of the laterally deflectable element and along a lengthwise extension of the further laterally deflectable element.

18. The MEMS device of claim 17, wherein the at least one second opening and the at least one fourth opening are formed in the same layer of the first layer and the third layer and form a contiguous opening.

19. An assembly, comprising:
at least one MEMS device according to claim 1; and
a control circuit configured to provide at least a first potential for the laterally deflectable element of the at least one MEMS device in order to operate the laterally deflectable element as an actuator to influence the ambient fluid; and/or
a measurement circuit configured to measure at least a second potential of the laterally deflectable element in order to operate the laterally deflectable element as a sensor for the ambient fluid.

20. A method for operating a MEMS device according to claim 1, the method comprising:
laterally deforming the laterally deflectable element in a first direction by applying a potential in order to increase a volume of the first sub-cavity and decrease a volume of the second sub-cavity during a first time interval to influence the ambient fluid; and
laterally deforming the laterally deflectable element in an opposite second direction by applying the potential in order to increase the volume of the second sub-cavity and decrease the volume of the first sub-cavity during a second time interval to influence the ambient fluid.

21. A method for operating a MEMS device according to claim 1, wherein the laterally deflectable element and the passive element may move laterally relative to side walls of the first cavity in order to adjust volumes of the first sub-cavity and the second sub-cavity depending on the ambient fluid, and wherein the method comprises:
outputting a potential through the laterally deflectable element upon lateral deformation due to an external force application by the displacement of the laterally deflectable element and the passive element relative to the side walls of the first cavity.

* * * * *